United States Patent [19]

Watkins

[11] Patent Number: 4,475,233

[45] Date of Patent: Oct. 2, 1984

[54] RESISTIVELY DAMPED LOUDSPEAKER SYSTEM

[76] Inventor: William H. Watkins, 1019 E. Center St., Kingsport, Tenn. 37660

[21] Appl. No.: 309,849

[22] Filed: Oct. 8, 1981

[51] Int. Cl.³ .................................... H03G 5/00

[52] U.S. Cl. .................................... 381/99

[58] Field of Search .................... 179/1 D, 1 GA; 333/28 T, 132; 381/89, 99, 100, 24

[56] References Cited

U.S. PATENT DOCUMENTS

| | | | |
|---|---|---|---|
| 2,612,558 | 9/1952 | Klipsch | 179/1 D X |
| 3,727,004 | 4/1973 | Bose | 381/99 X |
| 3,838,215 | 9/1974 | Haynes, Sr. | 179/1 D |
| 3,838,216 | 9/1974 | Watkins | 179/1 D X |
| 3,984,635 | 10/1976 | Nestorovic et al. | 381/89 |
| 4,031,321 | 6/1977 | Bakgaard | 179/1 D |
| 4,133,975 | 1/1979 | Barker | 179/1 GA |

FOREIGN PATENT DOCUMENTS

| | | | |
|---|---|---|---|
| 55-74292 | 6/1980 | Japan | 179/1 GA |

*Primary Examiner*—G. Z. Rubinson
*Assistant Examiner*—Keith E. George
*Attorney, Agent, or Firm*—Larson and Taylor

[57] ABSTRACT

A loudspeaker system is provided wherein the coils, capacitors, and loudspeaker drive units and combinations thereof are resistively damped to provide electrical damping of the back EMF of these components and thereby reduce ringing in the loudspeaker crossover networks. The result is a measurable and clearly audible improvement in the accuracy of the sound produced by the loudspeaker system.

4 Claims, 2 Drawing Figures

RESISTIVELY DAMPED LOUDSPEAKER SYSTEM

FIELD OF THE INVENTION

The present invention relates to loudspeaker systems and, more particularly, to an improvement in loudspeaker systems which results in cleaner and more natural sound from such systems.

BACKGROUND OF THE INVENTION

As is obvious to those familiar with the field of high fidelity loudspeakers, many different loudspeaker systems have been designed in an attempt to improve the quality of the sound produced by the systems. Some examples of such attempts are the systems disclosed in U.S. Pat. Nos. 2,054,647 (Ballatine); 2,084,160 (Minton et al); 2,612,558 (Klipsch); 3,814,857 (Thomasen); 3,838,215 (Haynes, Jr.) and 4,015,089 (Ishii et al). While many improvements have, of course, been made in this field over the years, the quest still goes on in the loudspeaker art with respect to attempting to improve the sound produced by such loudspeakers.

SUMMARY OF THE INVENTION

In accordance with the invention, provision is made for electrical damping of the coils, capacitors and loudspeaker drive units of loudspeaker systems and more particularly, for resistive damping of the back EMF of such coils, capacitors, drive units and combinations thereof, so as to reduce the ringing voltage in the loudspeaker crossover networks. The invention reduces system ringing and provides a loudspeaker output which is significantly more accurate, i.e., which more closely resembles the electrical input to the loudspeaker system, than is provided by such systems without this damping. These benefits and results are measurable and can be demonstrated, and in particular, are quite audible in the output sound produced by the loudspeaker system—the sound being cleaner and more natural.

The resistive damping of the invention is provided by damping resistors which are connected in shunt with the capacitors, coils and drive units of the loudspeaker system and with combinations thereof, e.g., with parallel combinations of capacitors and coils. It is important to note that these damping resistors are not frequency shapers and, in fact, are not required to shape frequency in the use thereof here.

Other features and advantages of the invention will be set forth in, or apparent from, the detailed description of the preferred embodiments which follows.

DESCRIPTION OF A PREFERRED EMBODIMENT

Figure 1:
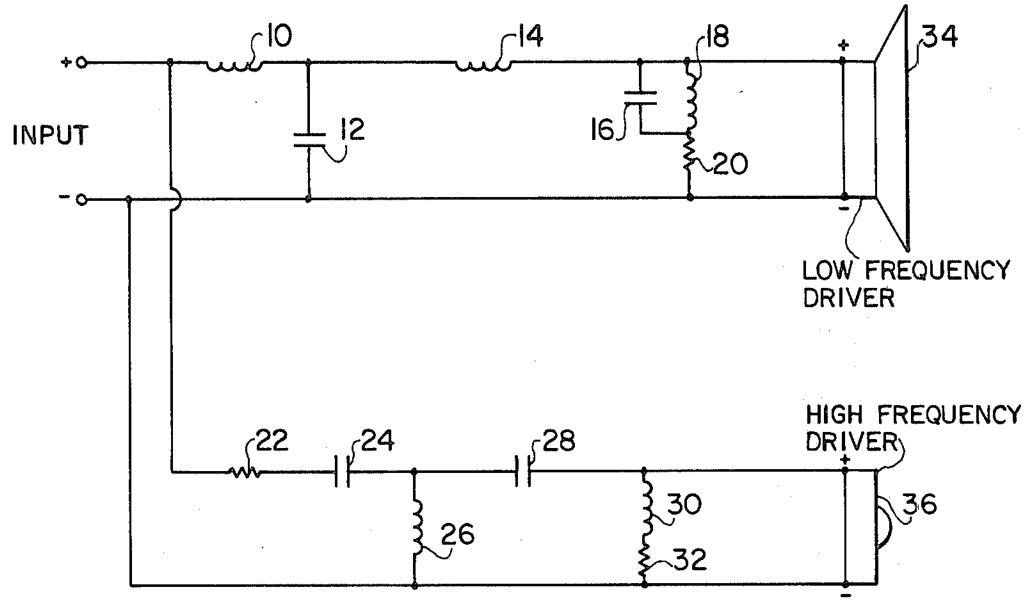
PRIOR ART FIG. 1
FIG. 1 is a schematic circuit diagram of a representative loudspeaker system of the prior art.

Referring to FIG. 1, the input circuitry for a prior art loudspeaker system includes conventional filters and other signal enhancing components formed or constituted by coils or inductances 10, 14, 18, 26 and 30, capacitors 12, 16, 24 and 28 and resistors 20, 22 and 32, connected as shown. For example, a low pass filter is formed by series connected coils 10 and 14 and shunt-connected capacitor 12 and is connected in a low frequency branch of the input circuit to a low frequency driver 34 while a high pass filter is formed by series-connected capacitors 24 and 28 and shunt-connected coil 26 and is connected in a parallel-connected high frequency branch of the input circuit to a high frequency driver 36. It will be understood that the loudspeaker system and the input circuitry shown in FIG. 1 are merely exemplary of loudspeaker systems (and input circuitry) in which the invention can be incorporated.

Figure 2:
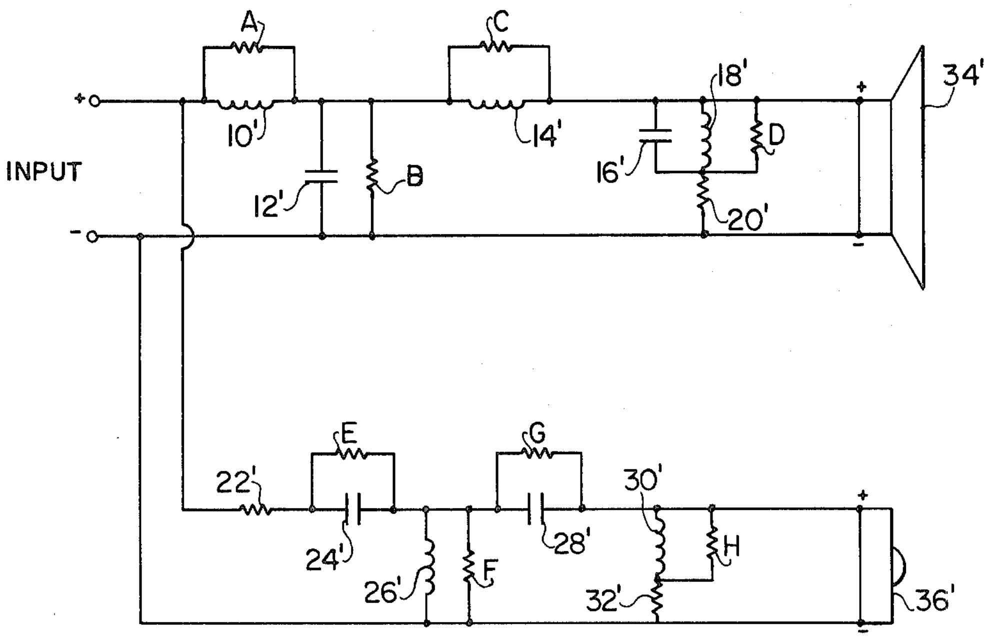
FIG. 2 is a loudspeaker system as shown in FIG. 1 but with the resistive damping of the invention incorporated therein.

Referring to FIG. 2, a loudspeaker system is shown in which the invention is incorporated but which apart from the invention is the same as that in FIG. 1. Accordingly, corresponding elements in FIG. 2 have been given the same numerals as in FIG. 1 but with primes attached. As will be evident from comparing FIGS. 1 and 2, the latter differs from the former in the provision of damping resistors A to H connected in shunt with the reactive components of the loudspeaker systems. Thus, for example, damping resistors A and C are connected across coils 10' and 14' and a further damping resistor B is connected across capacitor 12'. It will be noted that a single damping resistor D is connected across the parallel combination of capacitor 16' and coil 18'.

As discussed above, by resistively damping the back EMF of the coils, capacitors, drive units and combinations thereof, the ringing voltage is reduced in the loudspeaker crossover circuit networks. This reduces system ringing and results in an acoustic output which is more precise or accurate than prior art systems, i.e., an output which more closely resembles the electrical input signal to the system. It is important to note that, as stated, these improved results are clearly audible in the output sound produced by the loudspeaker system, the sound being cleaner and more natural. Again, it should be emphasized that damping resistors A to H of FIG. 2 are not used as frequency shapers and are not required for this purpose as used here.

Although the invention has been described relative to an exemplary embodiment thereof, it will be understood by those skilled in the art that variations and modifications can be effected in this exemplary embodiment without departing from the scope and spirit of the invention.

I claim:

1. In a loudspeaker system comprising at least a high frequency loudspeaker driver unit and a low frequency loudspeaker driver unit, and input circuitry connected to said driver units and comprising crossover networks comprising capacitors and coils, the improvement comprising resistive damping means for electrically damping the back EMF of the system coils, capacitors, drive units and combinations thereof to reduce the ringing voltage in the loudspeaker crossover networks, said resistive damping means comprising a plurality of damping resistors individually in shunt with a like plurality of individual capacitors and coils, and a said damping resistor being connected in shunt with each of the individual capacitors and coils of the system.

2. A loudspeaker system as claimed in claim 1 wherein the input circuit connected to at least one of said driver units comprises a parallel combination of a capacitor and a coil and said resistive damping means includes a damping resistor connected in parallel with said parallel combination.

3. A loudspeaker system as claimed in claim 1 or 2 wherein the input circuitry connected to the low frequency driver unit includes a low pass filter comprising a pair of series-connected coils and a shunt-connected capacitor and said resistive damping means includes a damping resistor connected across each of the series-connected coils and the shunt-connected capacitor.

4. A loudspeaker system as claimed in claims 1 or 3 wherein the input circuitry connected to the high frequency driver unit comprises a high pass filter comprising a pair of series-connected capacitors and a shunt-connected coil and said resistive damping means includes a damping resistor connected across each of the series connected coils and the shunt-connected capacitor.

* * * * *